(12) United States Patent
Sutton

(10) Patent No.: US 7,321,328 B1
(45) Date of Patent: Jan. 22, 2008

(54) SINGLE BIT DAC WITH TRISTATE DRIVER

(75) Inventor: Todd Sutton, Del Mar, CA (US)

(73) Assignee: NextWave Broadband Inc., San Diego, CA (US)

( * ) Notice: Subject to any disclaimer, the term of this patent is extended or adjusted under 35 U.S.C. 154(b) by 0 days.

(21) Appl. No.: 11/469,782

(22) Filed: Sep. 1, 2006

(51) Int. Cl.
*H03M 1/82* (2006.01)

(52) U.S. Cl. .................................... 341/152; 341/144

(58) Field of Classification Search ................ 341/144, 341/152, 145; 326/57, 58, 56
See application file for complete search history.

(56) References Cited

U.S. PATENT DOCUMENTS

| | | | |
|---|---|---|---|
| 5,337,338 A | 8/1994 | Sutton et al. | |
| 6,172,633 B1 * | 1/2001 | Rodgers et al. | 341/152 |
| 6,362,766 B1 * | 3/2002 | Rowan et al. | 341/152 |
| 7,098,833 B2 * | 8/2006 | Stulik et al. | 341/155 |

\* cited by examiner

*Primary Examiner*—Brian Young
(74) *Attorney, Agent, or Firm*—Townsend and Townsend and Crew

(57) ABSTRACT

A method for producing an analog output from a digital input is described. A digital pulse train is received having an average value which is proportional to a digital conversion value. The digital pulse train is driven at a periodic interval to produce a modulated tristate-gate output. The modulated tristate-gate output is averaged to produce an analog output. Optionally, the pulse train is also driven at an additional periodic interval having a duty cycle of more, or less, than less than 50%. The pulse train may also be driven steadily.

16 Claims, 11 Drawing Sheets

SINGLE BIT DAC WITH TRISTATE DRIVER

FIELD OF THE INVENTION

The present invention relates to electronic circuits in general and, in particular, to digital to analog conversion.

BACKGROUND OF THE INVENTION

Digital to analog converters (DACs) are devices for converting a digital input to an analog signal. Often, a binary number, in the form of a multi-bit word, is received by a DAC and converted to an analog signal in the form of current or voltage proportional to the number. For example, audio signals are stored in digital form but are converted to digital signal before being played. Also, data is often converted to analog signals before it is transmitted wirelessly. Switches, a network of resistors, current sources or capacitors may implement this conversion.

A classic current summing DAC uses matched resistors to convert a binary number to a corresponding voltage level, although it is difficult to maintain accuracy over a range of temperatures and as the number of bits per word increase. There are many different types of DACs available, including pulse width modulation, R-2R ladder, Binary Weighted, oversampling and delta sigma (i.e., $\alpha$-$\Sigma$) converters. Each has different strengths and weaknesses. There are often tradeoffs between size, latency, price, required voltage and current inputs, bits, resolution, etc. Oversampling has become increasingly popular in recent years as a method to avoid problems with noise and interference that often arise with conventional converters. However, these gains often require complex and fast digital signal processing stages.

Therefore, DACs employing simpler, lower cost designs which utilize standard digital components would generally be desirable. Using such components to approximate more costly $\alpha$-$\Sigma$ converters would also be beneficial. DACs implementing noise-shaping techniques to push noise to higher frequencies, while limiting the required current, would find many uses as well.

BRIEF SUMMARY OF THE INVENTION

Various embodiments of the invention comprise methods and devices for producing an analog output from a received digital input. In one exemplary embodiment, a digital pulse train is received having an average value which is proportional to a digital conversion value. The digital pulse train is driven at a periodic interval to produce a modulated tristate-gate output. The modulated tristate-gate output is averaged to produce an analog output.

In another embodiment, the pulse train is also driven at a second periodic interval, the second periodic interval having a duty cycle of less than 50% so that the modulated tristate-gate output is more often disabled than enabled. The mode comprising the second periodic interval may be entered in response to an indication to enter a low power operating mode. The mode comprising the second periodic interval may, alternatively, be entered in response to an indication to decrease the loop bandwidth of a feedback system in which the analog signal reflective of the digital conversion value is a control signal.

In another embodiment, the pulse train is also driven at a third periodic interval, the third periodic interval having a duty cycle of more than 50% so that the modulated tristate-gate output is more often enabled than disabled. The mode comprising the third periodic interval may be entered in response to an indication to increase the loop bandwidth of a feedback system in which the analog signal reflective of the digital conversion value is a control signal. Optionally, there may be an additional selectable mode that allows the pulse train to be driven steadily.

In certain embodiments, a number of accumulated addition operations are performed on the received digital input, and a carry out bit from each of the accumulated addition operations defines the pulse train. A clock cycle defines the output duration for each of the carry out bits, and the resulting pulse train is driven for only a portion of each output duration. The pulse train signal floats when it is not being driven. In one embodiment, the output duration of each carry out bit comprises the clock cycle, and the length of time for which the pulse train is driven at each periodic interval comprises one half the length of the clock cycle. In another embodiment, the length of time for which the pulse train is driven at each periodic interval is selectable from a number of fractional portions (e.g., greater than 50% of the time, or less than 50% of the time) of the clock cycle.

In one embodiment, the pulse train is driven by a Tristate driver. The Tristate driver is configured to shift between an enable input state and an open circuit state at a periodic interval, driving the pulse train received from the accumulator unit when in the enable input states. There may also be a control configured to keep the Tristate device in enable input state and thereby drive the serial digital output steadily. In some embodiments, an OR gate is coupled with a clock source and the Tristate driver, wherein a HIGH state output from the OR gate controls the Tristate driver to remain in enable input state. Alternatively, a LOW state output from the OR gate controls the Tristate driver to remain in open circuit state. A signal source coupled with the OR gate can operate in at least two modes: an Acquisition mode to control the OR gate to output a steady HIGH state, or a Track mode to thereby control the OR gate to output a state corresponding to the clock signal (i.e., which is periodic).

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

This description provides exemplary embodiments only, and is not intended to limit the scope, applicability or configuration of the invention. Rather, the ensuing description of the embodiments will provide those skilled in the art with an enabling description for implementing embodiments of the invention. Various changes may be made in the function and arrangement of elements without departing from the spirit and scope of the invention as set forth in the appended claims.

Thus, various embodiments may omit, substitute, or add various procedures or components as appropriate. For instance, it should be appreciated that in alternative embodiments, the methods may be performed in an order different than that described, and that various steps may be added, omitted or combined. Also, features described with respect to certain embodiments may be combined in various other embodiments. Different aspects and elements of the embodiments may be combined in a similar manner.

It should also be appreciated that the following described devices and methods may be a component of a larger system, wherein other procedures may take precedence over or otherwise modify their application. Also, a number of steps may be required before, after, or concurrently with the following embodiments.

According to various embodiments of the invention, methods and devices are described for producing an analog output from a digital input. In one embodiment, an accumulator unit is configured to produce an output representative of the carry out bit from each of a number of accumulated addition operations on a digital input. A Tristate driver is configured to shift between an enable input state and an open circuit or otherwise high impedance state at periodic intervals, and drive the pulse train received from the accumulator unit when in the enable input states. The pulse train is converted to an analog signal representative of the operand by averaging the pulse train over a period of time. Optionally, there is a second selectable mode that allows the pulse train to be driven steadily.

Figure 1:
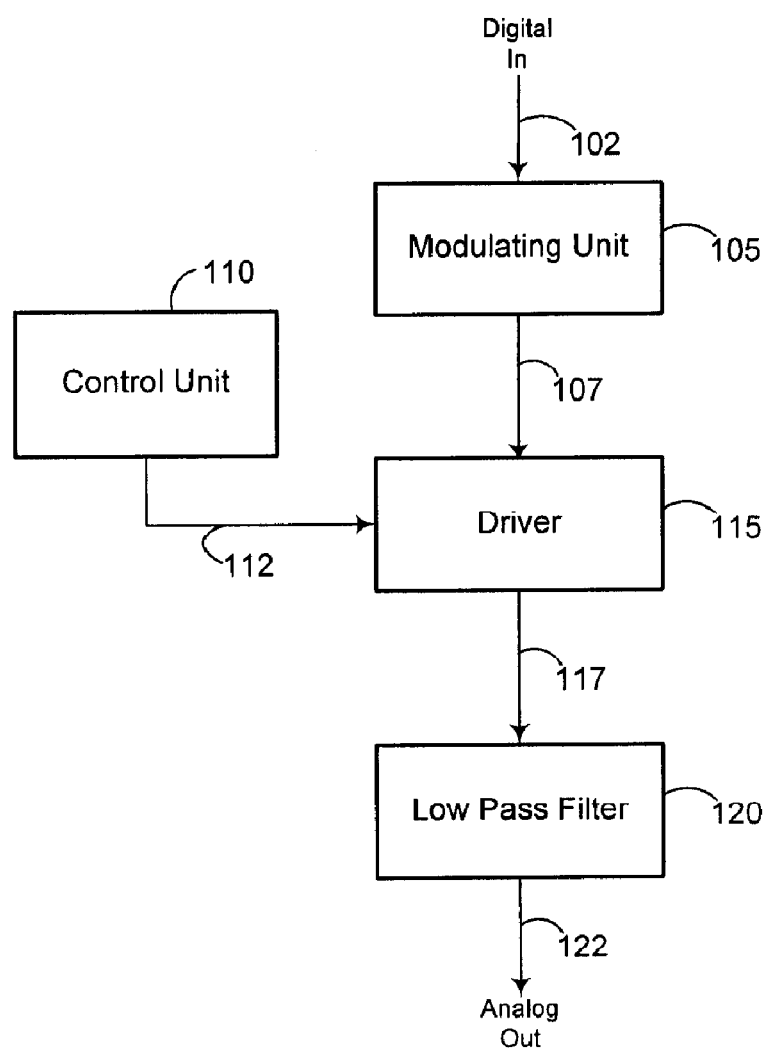
FIG. 1 is a simplified block diagram illustrating a device comprising a DAC configured according to various embodiments of the present invention.

FIG. 1 is an exemplary embodiment of the invention comprising a device 100 configured to convert a digital input into an analog output. In this exemplary embodiment, a modulating unit 105 is configured to receive a digital input 102. The digital input 102 may be received by a port of the modulating unit via a serial bitstream, or via a parallel port, or in any manner known in the art. In some embodiments, the digital input 102, the value of which may be referred to in some instances herein as operands, may comprise one or more multi-bit binary values.

The modulating unit 105 is configured to translate the digital input 102 into an output comprising a digital pulse train 107 having an average value which is proportional to a digital conversion value. The modulating unit 105 operates as a single bit DAC. A single bit DAC can be advantageous in many applications because a single bit DAC typically exhibits excellent linearity across the entire operating range. The digital pulse train may, for example, have a duty cycle that is proportional to the value of the digital input 102. There are a variety of circuit configurations which may be used to produce the digital pulse train.

In one embodiment, the modulating unit 105 is implemented using an accumulator configured to perform a number of addition operations on the operand presented at digital input 102. A carry output of the accumulator is coupled to the modulating unit output 107. The accumulator can perform, for example, modulo addition, where the modulus is based on the number of bits used to represent the digital value presented to the digital input 102. For example, if the operand at the digital input 102 is an N-bit digital value, the accumulator can be configured to perform modulo-$2^N$ addition. The carry output of the accumulator indicates when a sum exceeds the modulus.

The accumulator can initialize to a predetermined value, such as zero. The accumulator can be re-initialized upon power up or at some predetermined period or event. After initialization, the accumulator adds the first value of the operand to the initial value, for example zero, to produce a first sum. The output 107 remains in a low state as there is no bit to be carried (i.e., no overflow). The first sum is retained, and a second operand is added to the retained sum to produce a second sum. If the second sum triggers a carry-out, the carry bit is set and the modulating unit output 107 transitions to a high state based upon the second operation. This process is repeated for subsequent operands.

The modulating unit output 107 is coupled to the input of a driver 115. The driver 115 is configured to receive the digital pulse train and drive an output signal onto a driver output 117. The driver 115 also has a driver enable input 112. When enabled, the driver 115 produces an output signal on the driver output 117. When disabled, the driver output 117 transitions to a high impedance state and produces no output signal. A control unit 110 produces the driver enable input 112 to achieve the desired response according to the invention and as explained in more detail below. In one embodiment the driver 115 comprises a Tristate driver, and the control unit 110 is configured to control the Tristate driver to drive the digital pulse train 107 at a periodic interval to produce a modulated tristate-gate output 117.

The driver output 117 is coupled to a low-pass filter 120. The low pass filter 120 is configured to attenuate high frequency components of the driver output 117 while passing the lower frequencies. The low-pass filter 120, therefore, averages the modulated tristate-gate output 117 to produce an analog signal reflective of the digital conversion value. The output 122 of the low pass filter 120 is, therefore, an analog signal representative of the values presented with the input signal 102.

Figure 2:
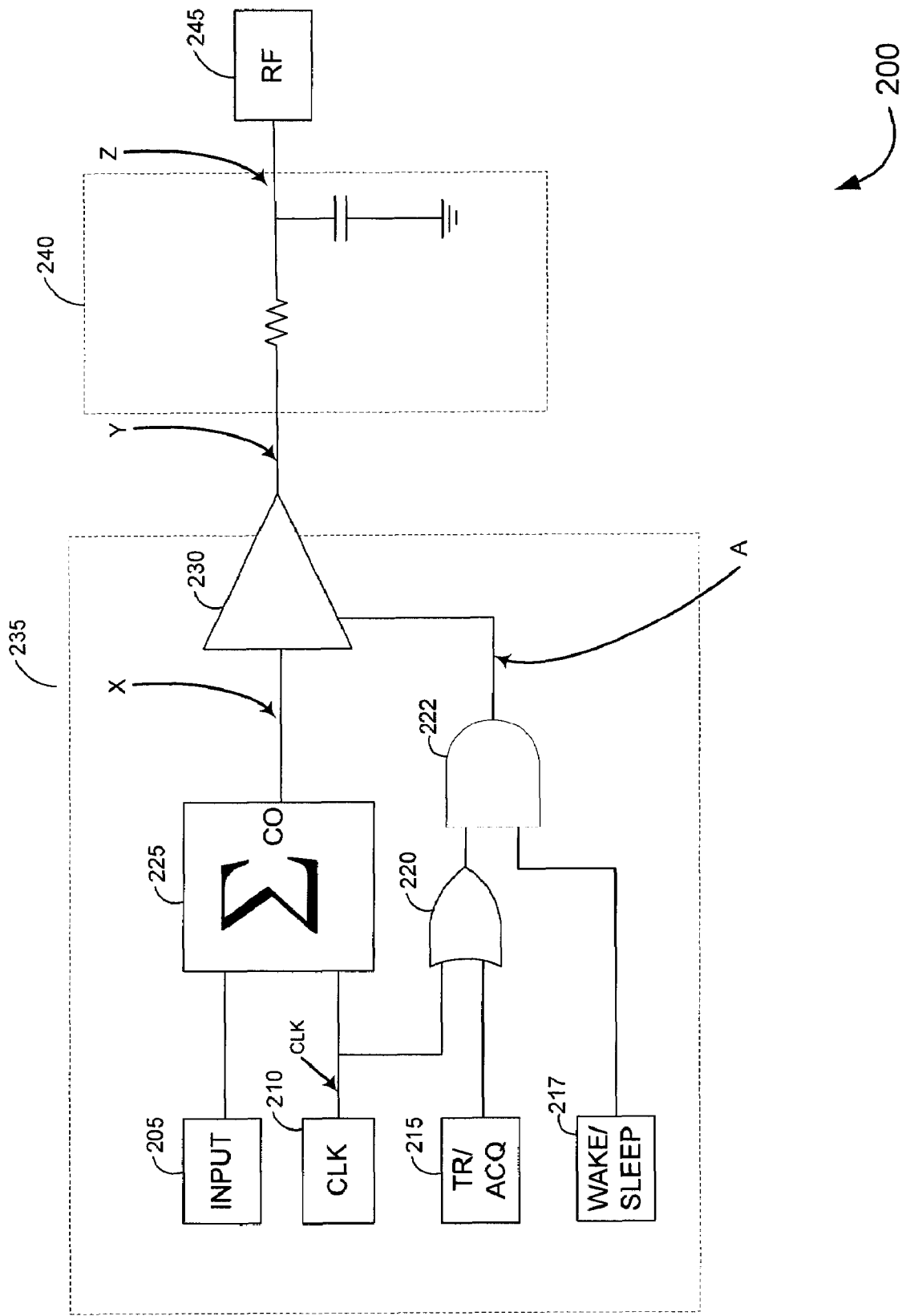
FIG. 2 is a simplified circuit diagram of a device comprising a DAC configured according to various embodiments of the present invention.

FIG. 2 is a schematic representation of the invention embodied in a device 200. The device 200 may be one or more integrated circuits, may be any number of discrete components, or may be a combination thereof. Some of the digital functions may also be implemented in software. In this exemplary embodiment, a component 235 of the device 200 is configured as a single integrated circuit comprised of digital logic.

An input source 205 provides a digital input via a bus. In this embodiment, the input source 205 provides one or more 8-bit words, with the digital value valid at the positive edge of the clock signal supplied by the clock source 210. The clock is operating, in this embodiment, at 256 MHz. The clock may be any oscillator, waveform generator, or other device known in the art that produces the requisite periodic signals. The input source 205 may be, in some embodiments, a pipeline register, FIFO, or some other device that is clocked with the clock signal.

An accumulator 225 receives the digital input and clock signal. In this embodiment, the digital input is an 8-bit binary word. An accumulator 225 can be implemented using an adder with an output of the adder fed back as an input. Upon initialization, the output of the adder can be zero, and the result of the first accumulation can be the input value. Subsequent accumulations sum the current output value to the new input value.

The accumulator 225 is configured as a modulo-256 ($2^8$) accumulator with a carry output. Thus, in this exemplary embodiment, the carry output from the accumulator 225 produces a serial digital output, X, where each bit from the carry output corresponds to a carry or overflow resulting from one of a plurality of accumulated addition operations.

The accumulator 225 couples the serial digital output, X, to a Tristate driver 230. The Tristate driver 230 has two output states. In the first state, the output Y is enabled. The Tristate driver 230 drives either a HIGH (logically equivalent to 1) or LOW (logically equivalent to 0) value as determined by the input X of the Tristate buffer. For example, if the Tristate driver 230 is a non-inverting digital buffer, the digital output Y from the Tristate driver 230 corresponds to the digital state of the serial digital signal X. In the second state, the output Y is disabled and the output of the gate transitions to a high impedance state and the Tristate driver 230 does not source any output signal. In the high impedance state, alternatively referred to as the open circuit state, the effect of the Tristate buffer 230 is essentially removed from the circuit.

In this embodiment of the invention, therefore, the Tristate driver 230 operates in an enabled state or an open circuit state based on a state of a signal, A, applied to its control input. When the state of the control signal, A, is HIGH or is otherwise asserted, the Tristate driver 230 is enabled. When the state of the control signal, A, is LOW, the Tristate driver 230 operates in open circuit or high impedance mode and its output Y floats. The Tristate driver 230 is described herein as having an active HIGH control input. However, the control input of the Tristate driver 230, and generally any of the control inputs described herein, can be configured as active HIGH or active LOW. The configuration as an active HIGH or active LOW input is not a limitation on the operation of the DAC.

A signal source 215 operates in conjunction with the clock source 210 and digital logic to generate the control signal, A. The output of the signal source 215 is coupled to a first input of a logical OR gate 220. The output of the clock source 210 is coupled to a second input of the OR gate 220. The OR gate 220 performs the logical OR of the input signals. The output of the OR gate 220 is coupled to an input of a logical AND gate 222. The output of the logical AND gate 222 supplies the control signal for the Tristate driver 230.

The logical AND gate 222 operates to selectively enable or disable the output of the component 235 regardless of the states of the clock 210 and signal source 215. A control source 217 is configured to output an enable or disable control signal that is coupled to an input of the logical AND gate 222.

In one embodiment, the control signal source 217 is configured to output a WAKE/SLEEP control signal. The control signal source 217 outputs an enable control signal when the device 200 is in the WAKE state and outputs a disable control signal when the device 200 is in a SLEEP state. In the embodiment shown in FIG. 2, the enable control signal corresponds to a logical HIGH and the disable control signal corresponds to a logical LOW.

When the control signal source 217 outputs the enable control signal, the logical AND gate 222 outputs a logic level that corresponds to the state of the input signal from the logical OR gate 220. In the SLEEP state, the control signal source 217 outputs a logical LOW and the logical AND gate 222 outputs a logical LOW regardless of the state of the other input to the logical AND gate 222.

In the SLEEP state, power consumption by the device 200 is minimized by selectively disabling the output of the Tristate driver 230. The control signal source 217 controls the Tristate driver 230 to a high impedance state during the SLEEP state. The charge is maintained on the capacitor in the low-pass filter 240. Maintaining the charge on the capacitor can be advantageous in embodiments that utilize the device 200 in a feedback loop, because the feedback loop can resume operation with the capacitor charged when the device 200 transitions back to a WAKE state. Maintaining the charge in the SLEEP state can reduce the acquisition time of a feedback loop upon transition from SLEEP to WAKE states.

During the WAKE state, the logical AND gate 222 has essentially no effect on the operation of the component 235. For the purposes of clarity, the remainder of the description of the device 200 assumes the device 200 is operating in the WAKE state.

The signal source 215 operates as a controller that configures the operating mode of the device 200. In the embodiment of FIG. 2, the device 200 can operate in one of two modes, "Track" mode and "Acquisition" mode. The signal source 215 can output a logical HIGH to control the device 200 to the Acquisition mode and can output a logical LOW to control the device 200 to the Track mode.

In the Acquisition mode, the output of the Tristate driver 230 remains enabled, and the Tristate driver 230 drives an output signal representative of its input. In the Track mode, the output of the Tristate driver 230 alternates between an enabled state and a high impedance state. The Tristate driver 230 drives an output signal only during the portion that its output is enabled. Thus, the Tristate driver 230 drives a lower average current in the Track mode compared to an average current in the Acquisition mode. The Track mode can thus be alternatively referred to as a "low current" mode and the Acquisition mode can alternatively be referred to as a "higher current" mode.

First, consider Track mode. When the output from the signal source 215 is LOW (the state corresponding to Track mode), the OR gate 220 output A is controlled by the output of the clock source 210. The clock signal outputs a HIGH and LOW state each clock cycle. Therefore, the OR gate 220 output A similarly shifts between a HIGH and LOW each clock cycle. As noted above, the OR gate 220 output A controls the Tristate driver 230 state and, thus, the Tristate driver 230 shifts between an enabled state and open circuit state each clock cycle.

Next, consider Acquisition mode. When the output from the signal source 215 is HIGH (the state corresponding to Acquisition mode), the OR gate output A simply remains HIGH, and is not controlled by the output of the clock source 210. As noted above, the OR gate 220 output controls the Tristate driver 230 state and, thus, by selecting Acquisition mode, the Tristate driver 230 remains in enable state, steadily driving the output.

Although the exemplary embodiment described above includes a Track mode and an Acquisition mode, in other embodiments, a device 200 may be configured to always run in Track mode. One way to configure such a device is to simply have the clock signal controlling the Tristate driver 230, eliminating the Acquisition mode. In such an embodiment, the Tristate driver 230 shifts between enable input state and an open circuit state, and back, each clock cycle. In still other embodiments, there are one or more additional "low current" modes. In such embodiments, the control input of the Tristate driver 230 can be in an active state for some other duty cycle. In such an embodiment, the serial digital output may be driven less often (e.g., ¼ time, ⅒ time, etc.), or more often (e.g., ¾ time). Thus, the duty cycle of the Tristate driver 230 may be adjusted to be more, or less, than the 50% level shown in the Track mode embodiment of FIG. 2.

Counters, comparators, and other methods may be used to vary the Tristate driver 230 control input signal to vary the length of time each carry out bit of the serial digital output from the accumulator is to be driven. In still other embodiments, the Tristate driver 230 shifts between an enable input state and an open circuit state at another periodic intervals (e.g., every two cycles, or every four cycles, etc.), and drives the serial digital output received from the accumulator unit during the enable input states.

While in some of the above embodiments an OR gate 220 is used to switch the Tristate driver 230 between enable state and open circuit state in periodic intervals corresponding to the clock signal, other digital circuit configurations may provide similar control functionality, as is evident to one skilled in the art. In another embodiment, the control input signal to the Tristate driver 230 is independent of the clock signal. Moreover, although a single Tristate driver 230 is used to drive the serial digital output at periodic intervals, other configurations may provide similar functionality.

The output of the Tristate driver 230 is coupled to the output of the component 235. The output of the component 235 is coupled to an input of a filter, here shown as a low pass filter 240. A low pass filter 240 is configured to average the output Y of the Tristate driver 230, and thereby convert the output to an analog signal Z. In one embodiment, the component 235 described above, which includes the accumulator 225 and Tristate driver 230, is integrated as a component into a larger device 200. This component 235 is configured using digital logic as a single integrated circuit, although a variety of other configurations are possible.

The output Y of the component 235 is received by a low-pass filter 240, which filters the higher frequency noise and averages the periodically driven output from the Tristate driver 230. In midrange voltages, the received serial digital output is being switched rapidly, thus pushing the noise to higher frequencies and making it easy to filter. However, to achieve particular performance characteristics, worst case noise voltage and operating frequencies are considered when selecting the low-pass filter. In this embodiment, the low-pass filter comprises an RC filter. Further, the resistor and capacitor each comprise a discrete component. However, it is worth noting that in other embodiments the low-pass filter may be a single integrated circuit, or, alternatively, the device 200 itself may be a single integrated circuit. The output from the low-pass filter 240 is received by the RF analog integrated circuit 245 in this embodiment.

Figure 3A:
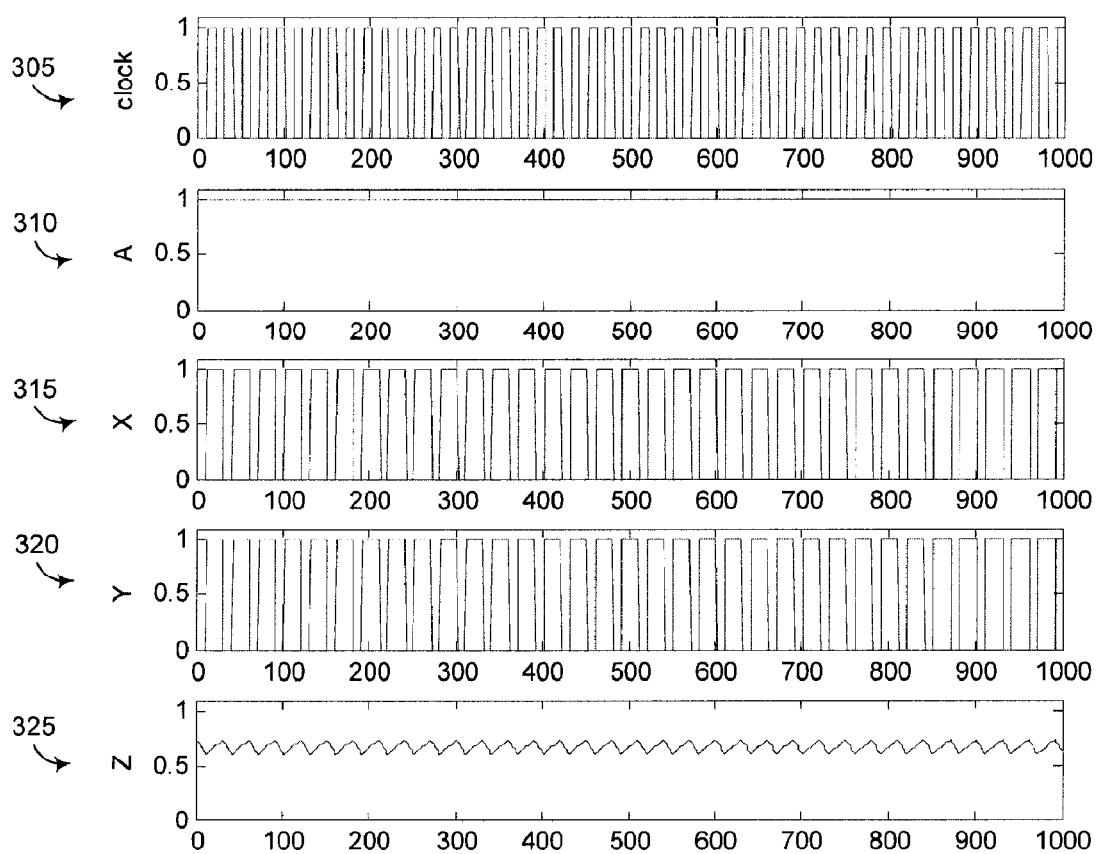
FIGS. 3A and 3B illustrate exemplary waveforms in a device comprising a DAC in Acquisition mode, configured according to various embodiments of the present invention.
Figure 3B:
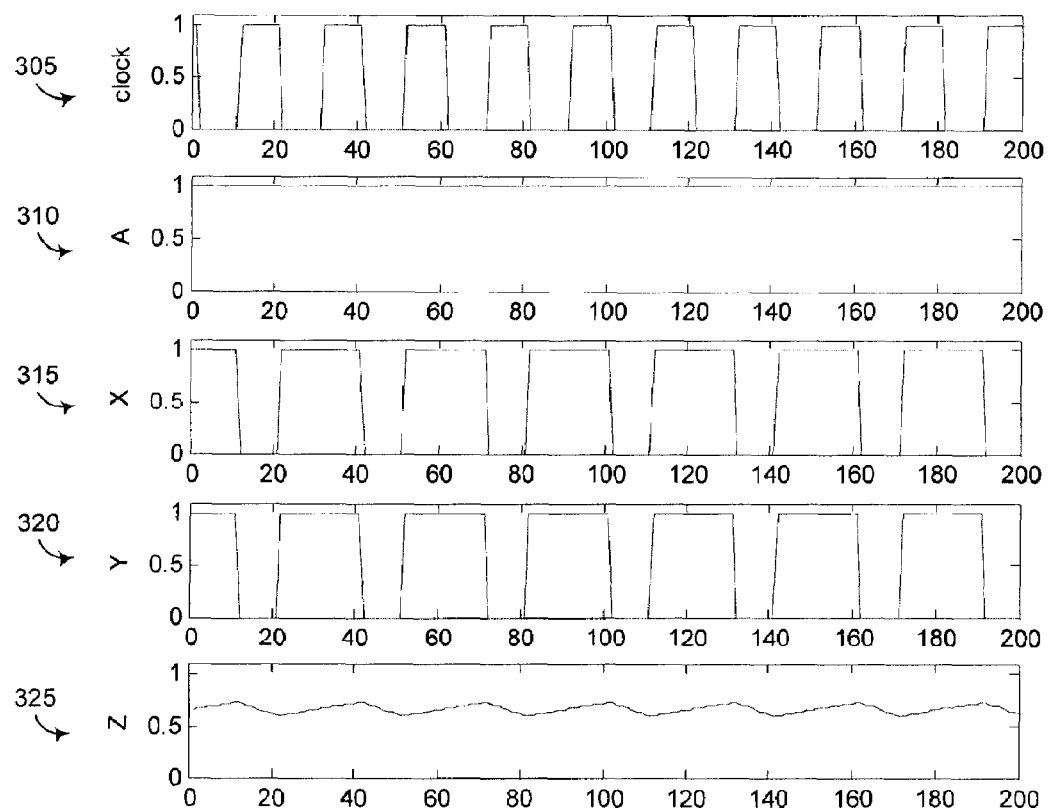
Figure 4A:
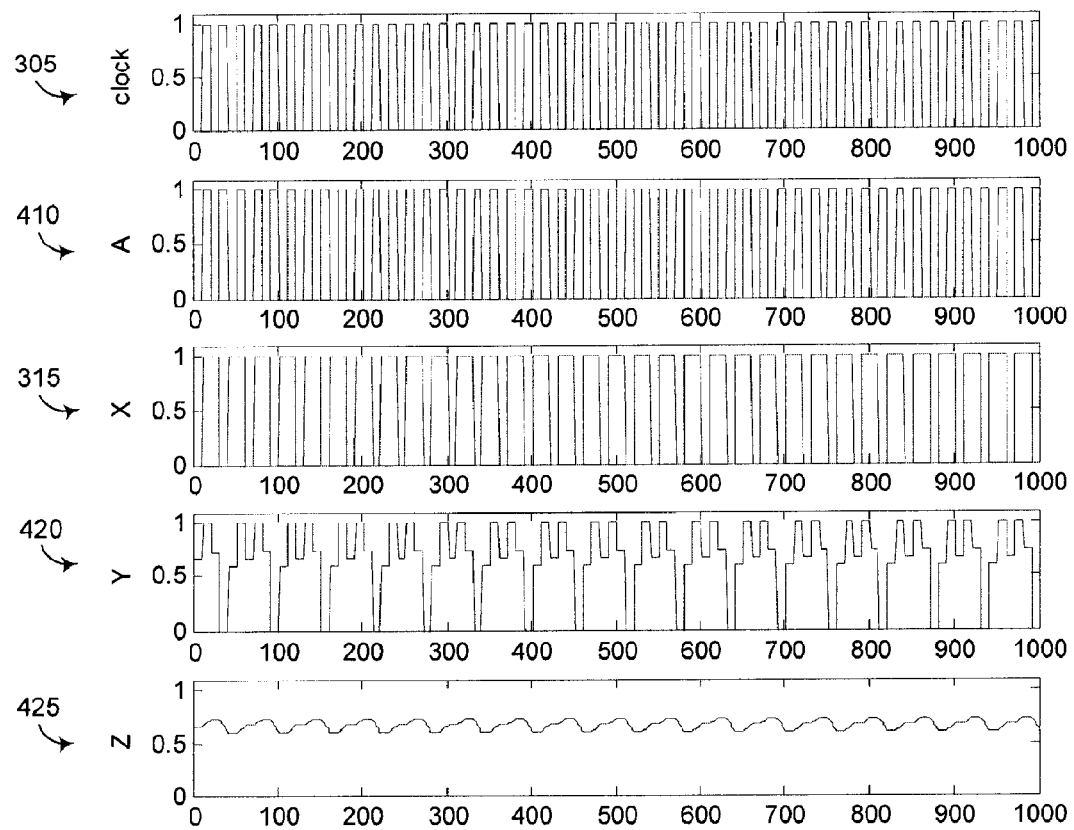
FIGS. 4A and 4B illustrate exemplary waveforms in a device comprising a DAC in Track mode, configured according to various embodiments of the present invention.
Figure 4B:
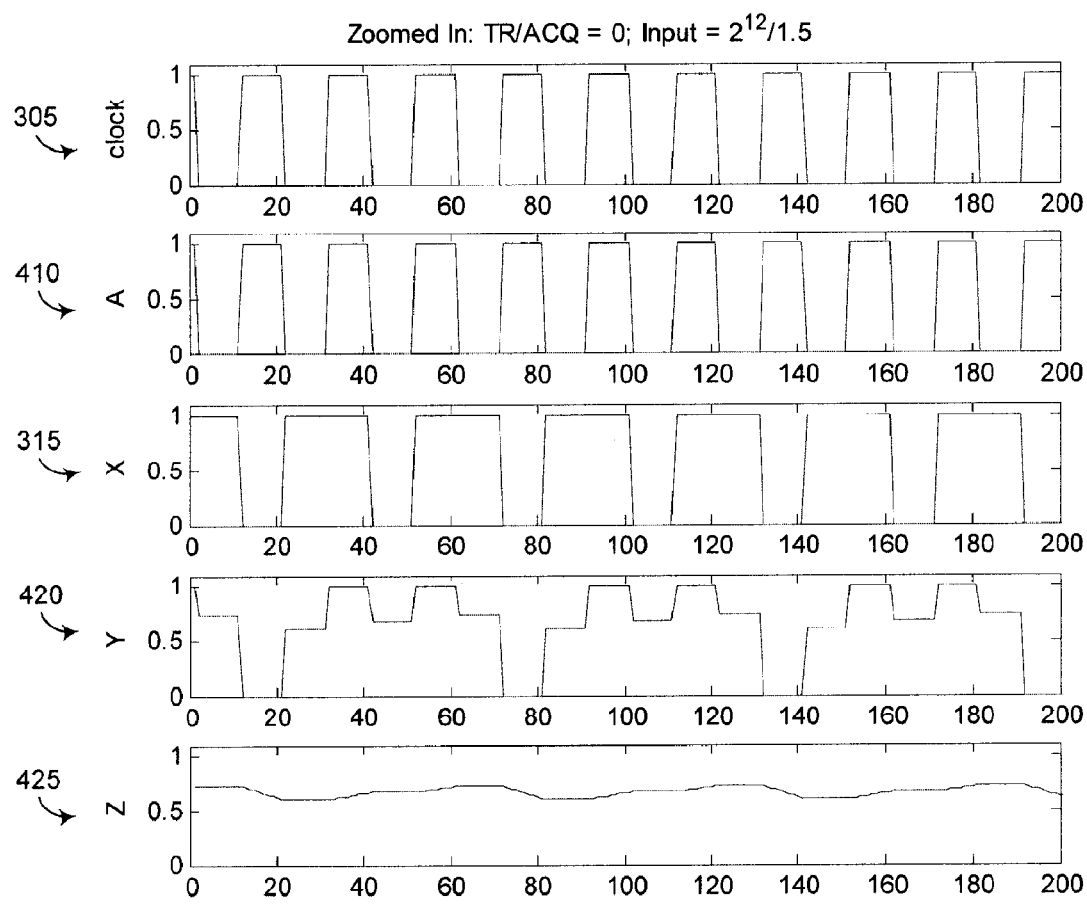

FIGS. 3A, 3B, 4A and 4B illustrate an example of the various signal waveforms (A, X, Y, and Z) that can be monitored in the device of FIG. 2 when converting a digital input to an analog representation. These waveforms are shown in various modes described above. Specifically, FIGS. 3A and 3B illustrate an example of Acquisition mode, whereas FIGS. 4A and 4B illustrate an example of Track mode.

In the example illustrated in FIGS. 3A, 3B, 4A and 4B the device is configured to convert a 12-bit digital input to an analog representation. Signal 315 represents the output X of the accumulator 225, which is a representation of the carry out bit during each clock cycle. The timing diagrams illustrated in FIGS. 3A and 3B, and in 4A and 4B show different outputs (A, Y, and Z) resulting from the different operating modes. The signals A, Y, and Z are produced using the same digital input signal (not shown) corresponding to the same carry out signal X.

In the example illustrated in FIGS. 3A, 3B, 4A and 4B, the 12-bit digital input is set to $2^{12}/1.5$, or 101010101010b. This value represents approximately ⅔ of the full scale value of the digital input. The accumulator 225 is configured to perform modulo-4096 accumulations with a carry output ($4096=2^{12}$).

First, consider Acquisition mode, illustrated by the timing diagrams 300A of FIGS. 3A and 300B of FIG. 3B. Timing diagrams 300B of FIG. 3B merely represent the zoomed view of 300A. As described above, in Acquisition mode, the received serial digital output is driven steadily by the Tristate driver 230. This is because the Tristate driver 230 is always enabled, as the OR gate output A 310 simply remains HIGH. The Tristate driver 230, in Acquisition mode, produces output Y 320. The output of the Tristate driver 230 is approximately the same as the input. The Tristate driver 230 drives output signal Y 320 throughout the conversion period, as the Tristate driver 230 is always enabled. This signal Y 320 is passed through the low-pass filter 240 to produce output Z 325.

With the operand $(\frac{2}{3}) \times 2^{12}$ reflected in this signal Y 320, there is approximately two signal transitions for every three clock cycles. For purposes of comparison, a Pulse Width Modulation (PWM) DAC with a 12-bit input performs a conversion in approximately 4096 ($2^{12}$) clock cycles. However, a PWM DAC has only one transition in the conversion period. In contrast, the DAC embodiment illustrated in FIG. 2 has an increased number of transitions in the same number of clock cycles for this digital input value. In general, for any digital input value, the accumulator output exhibits a number of signal transitions that is equal to or greater than the number of signal transitions from a PWM DAC. The increased number of transitions per conversion period can be advantageous, as the magnitude of low frequency noise components is typically reduced with the increased number of transitions.

Compare the signals (A, Y, and X) produced in Track mode, illustrated by the timing diagrams 400A of FIGS. 4A and 400B of FIG. 4B. Timing diagrams 400B of FIG. 4B represent the zoomed view of 400A. As described above, in Track mode, the Tristate driver 230 periodically drives the received serial digital output from the accumulator. This is because, in this embodiment, the driver is only enabled when the clock signal is HIGH. When the clock signal 305 is HIGH, the OR gate 220 output A 410 controls the Tristate driver 230 to drive the received serial digital output. When the clock signal 305 is LOW, the OR gate 220 output A 410 shifts the Tristate driver 230 to an open circuit high impedance output mode. When the Tristate driver 230 is in the high impedance output state, the output Y 420 floats, and the value of the output Y 420 follows the voltage at the output of the filter.

The periods of floating and driving are illustrated for the signal Y 420 in the timing diagrams. There are, approximately two transitions every clock cycle, instead of the single transition in Acquisition mode. The Tristate driver 230 in this example is driving only half the time. Track mode may be used to effectively reduce the bandwidth of the output signal. The periodic transition to a high impedance output provides substantially the same effect as doubling the resistive component of the RC (because less current is produced with the Tristate driving only half time). Also, because there are two transitions per clock cycle, the number of events per conversion period is doubled, so the noise is pushed to higher frequencies. This signal Y 420 is passed through the low-pass filter 240 to produce output Z 425.

In certain instances, it may be desirable in Track mode to drive the received serial digital output even less frequently (e.g., less than half time). A lower current mode corresponds to a lower bandwidth mode. For example, instead of driving the received serial digital output half the time, it may be driven one quarter time for each clock cycle and, in this embodiment, even less current is expended. This exemplary Low Current mode may be used to significantly raise the effective R of the RC over standard Track mode, in which the Tristate driver is enabled one-half the time, because less current is produced with the Tristate driving only quarter time.

In other instances, it may be desirable in Track mode to drive the received serial digital output X more frequently (e.g., more than half time). A higher current Track mode corresponds to a higher bandwidth mode, although still less than the signal bandwidth of the Acquisition mode. For example, instead of driving the received serial digital output half the time for each clock cycle, it may be driven three quarter time and, in this embodiment, more current is expended (although less than in Acquisition mode).

There are a variety of circuit configurations evident to those skilled in the art to further increase or decrease, or otherwise vary, the relative length of the drive period compared to the float period. One way to achieve this would be to configure a control (e.g., with a counter) to have a Tristate driver 230 shift to an enable input state from an open circuit state at other periodic intervals (e.g., every two cycles, or every four cycles, etc.), and have the duration of the enable state remain one half cycle. Alternatively, there are a variety of configurations to vary the duration of the enable state, for example via delay circuits (e.g., drive the Tristate output each cycle, for ¼, or ¾, time). Disabling the Tristate output for more time saves power, but further reduces the bandwidth. More broadly stated, controlling the duration of the period over which the Tristate driver is enabled controls the bandwidth. The longer the output is disabled relative to begin enabled, the lower the loop bandwidth. In some embodiments, the length of time for which the received serial digital output is driven in each periodic interval is selectable from a plurality of fractional portions of the periodic interval.

Figure 5:
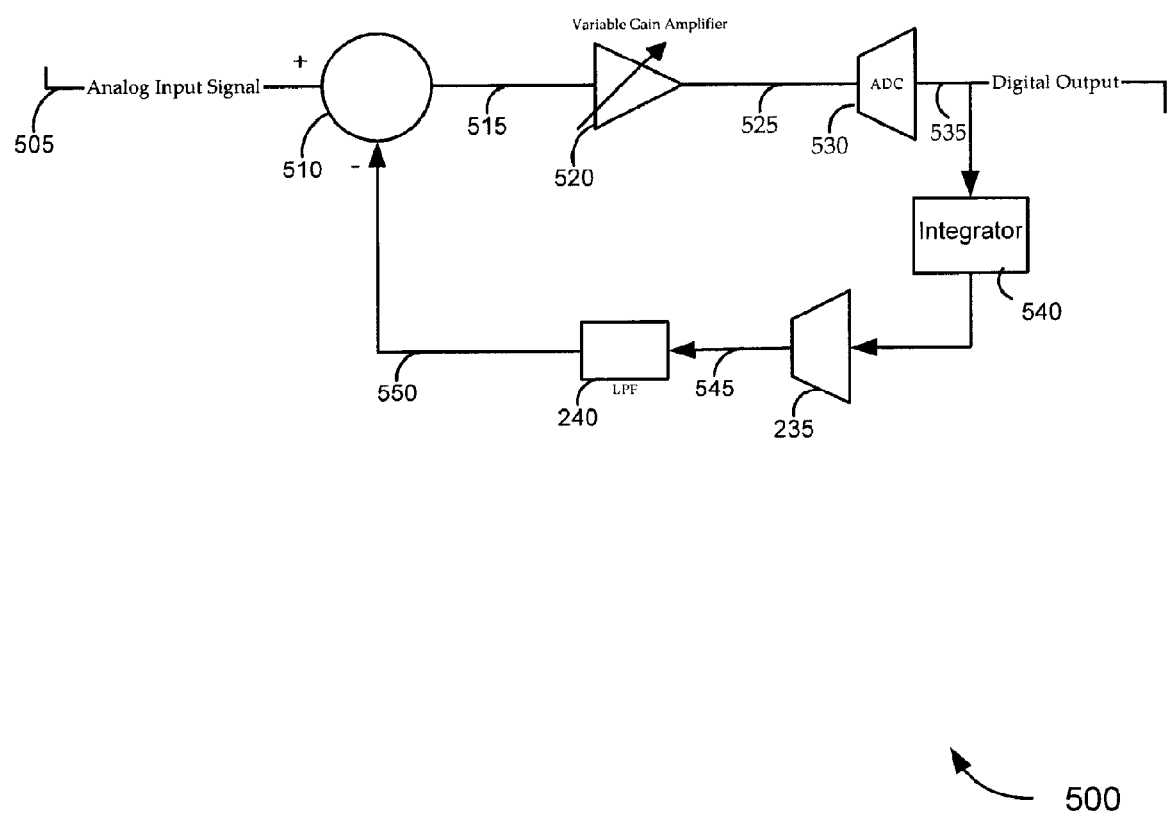
FIG. 5 is a simplified circuit diagram illustrating a DC offset control loop configured according to various embodiments of the present invention.

FIG. 5 illustrates a simplified functional block diagram of an embodiment of a DC offset control loop 500, configured to cancel DC offset, using the DAC disclosed herein. For example, the DAC can be the device illustrated in FIG. 2.

In an embodiment, an analog input signal 505 containing an incidental DC offset is received and coupled to the positive input of a summing junction 510. An analog offset adjustment signal 550 (described below) is supplied to the negative input of the summing junction 510. The summing junction 510 subtracts the analog offset adjustment signal 550 from the analog input signal 505 to produce an adjusted analog signal 515. This signal will, ultimately, comprise a DC offset corrected signal (i.e., the DC offset will be substantially canceled) once the loop has settled to a steady state value. This adjusted analog signal 515 is then amplified by a Variable Gain Amplifier 520 to produce an amplified analog signal 525. This amplified analog is then digitized by an ADC 530, to produce a digitized output 535.

The digitized output 535 represents the output of the DC offset control loop 500, and represents the digital representation of an amplified version of the analog input signal with any DC offset removed. The digitized output 535 is also coupled to a feedback path that is configured to generate the analog offset adjustment signal 550, which is fed back to the negative input of the summing junction 510.

The feedback path includes an integrator 540 that is configured to integrate the digital output 535. In one embodiment, the integrator 540 is configured to integrate the digital output 535 over a defined period of time. In another embodiment, the integrator 540 is configured to filter or otherwise average the digital output 535. For example, the integrator 535 can be configured to output an average of the last N digital output values, where N is a predetermined integer value. The output of the integrator 540 is coupled to a component 235, such as the component described above in relation to FIG. 2. The component 235 includes an accumulator, Tristate driver, and tristate controller as shown in FIG. 2. The component 235 can include a clock generator or can use a clock signal that is generated external to the component 235.

The component 235, as described above, receives the digital signal at the output of the DC offset control loop 500 and produces a modulated tristate-gate output 545. The low-pass filter 240 averages the modulated tristate-gate output 545 to produce an analog offset adjustment signal 550 reflective of the DC component of the digitized output 535. The analog offset adjustment signal 550 is subtracted from analog input signals to cancel the DC offset component.

Acquisition mode is appropriate for the DC offset control loop 500 when, for example, there is a large change in amplification and a new offset needs to be acquired quickly. In an embodiment, the DC offset control loop 500 can operate in Acquisition mode periodically, upon the occurrence of a predetermined event, or some combination thereof.

During Acquisition mode, the Tristate driver within the component is continuously enabled. The Tristate driver, and thus the component 235, continuously drives a signal to the low-pass filter 240. The loop bandwidth of the DC offset control loop 500 can be largely determined based on the bandwidth of the low-pass filter 240. The ability of the feedback path to adjust to perturbations in the DC offset is not constrained by the Tristate driver.

In Acquisition mode, the loop bandwidth of the DC offset control loop 500 is larger than in Track mode. However, the average current consumed by the DC offset control loop 500 in Acquisition mode is typically larger than the average current consumed in Track mode, because the Tristate driver is continuously enabled and driving a signal to the low-pass filter 240. The increased loop bandwidth and decreased acquisition time come at the cost of increased average current consumption.

After operating in Acquisition mode for a predetermined period of time, the DC offset control loop 500 can transition to Track mode. The predetermined period of time can be determined based at least on the loop bandwidth of the tracking loop in Acquisition mode. In an embodiment, the predetermined period of time can be a function of a time constant of the low-pass filter. For example, the DC offset control loop 500 can transition from Acquisition mode to Track mode following a duration of approximately six times the time constant of the low-pass filter 240.

In Track mode, the loop bandwidth of the DC offset control loop 500 is decreased, based on the duty cycle of the Tristate driver enable control signal. For example, enabling the output of the Tristate driver at about a 50% duty cycle results in approximately a halving of the loop bandwidth. Decreasing the loop bandwidth may be advantageous, for example, to reduce the loop sensitivity to noise and to low frequency signal components in the digitized output signal.

Operating the DC offset control loop 500 in Track mode reduces the average current consumed by the loop, because the Tristate driver is driving a signal to the low-pass filter 240 for only a portion of the time. Operating in Track mode also reduces the loop bandwidth. In Track mode, disabling the Tristate output for proportionally more time saves power, but further reduces the loop bandwidth. More broadly stated, controlling the duration of the period over which the Tristate driver is enabled controls the loop bandwidth. The more often the Tristate output is disabled or otherwise in a high impedance state, the lower the loop bandwidth.

Figure 6:
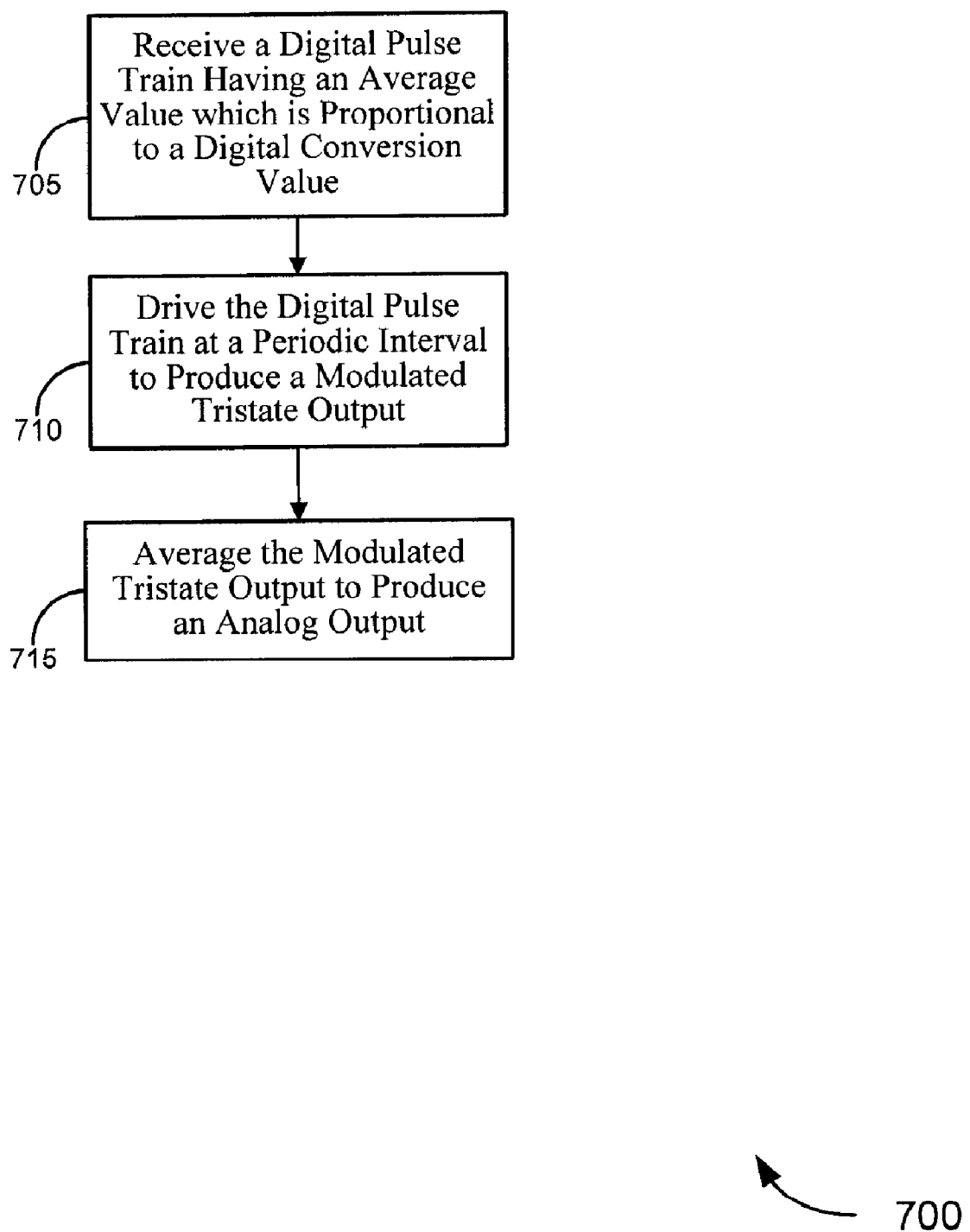
FIG. 6 is a flowchart illustrating a method of converting a digital input to an analog output, according to various embodiments of the present invention.

FIG. 6 sets forth an exemplary embodiment 700 of the invention, illustrating a method of converting a digital input to an analog output. At block 705, a digital pulse train is received having an average value which is proportional to a digital conversion value. At block 710, the digital pulse train is driven at a periodic interval to produce a modulated tristate-gate output. At block 715, the modulated tristate-gate output is averaged to produce an analog output.

Figure 7:
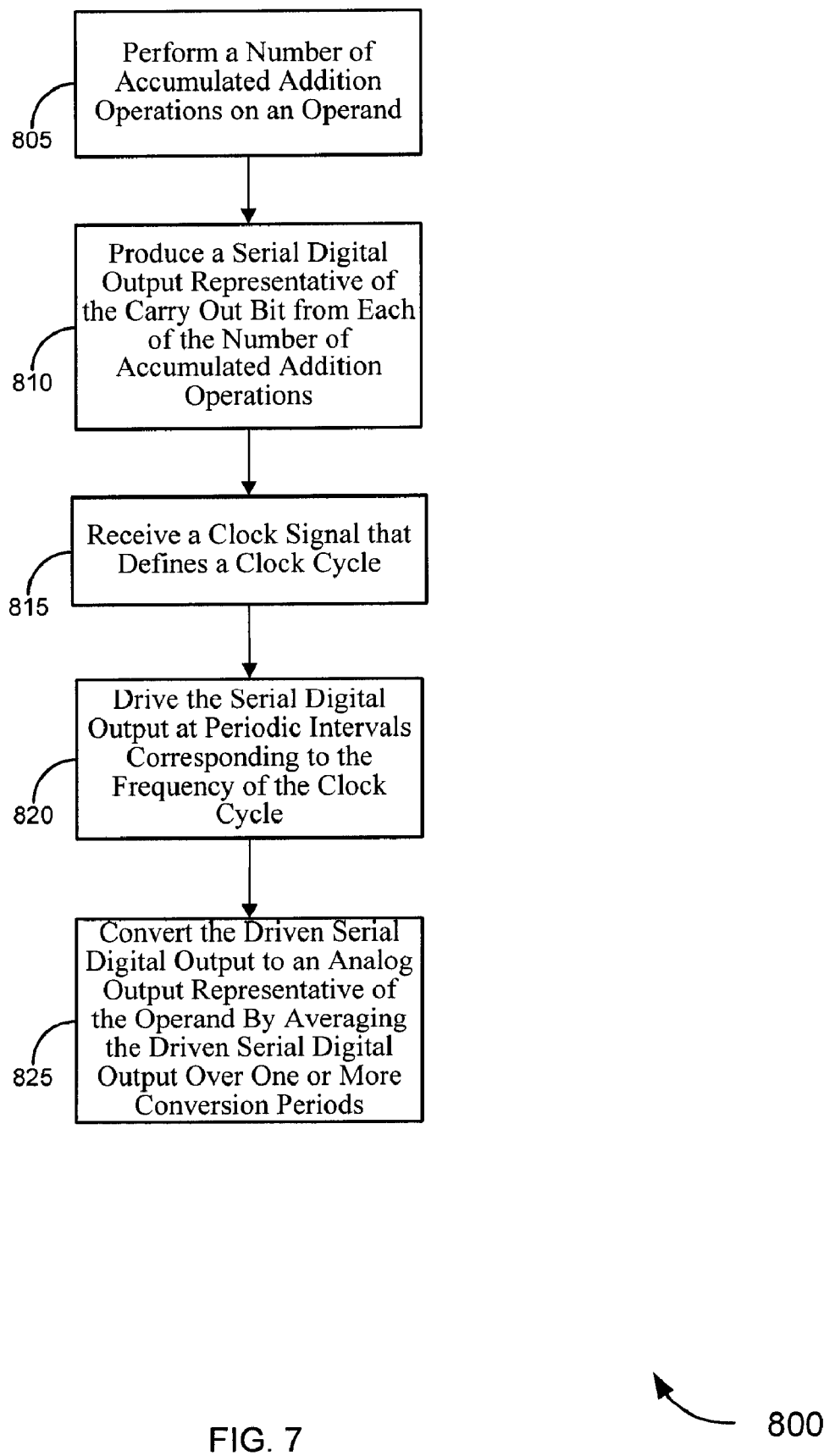
FIG. 7 is a flowchart illustrating an alternative method of converting an operand to an analog output, according to various embodiments of the present invention.

FIG. 7 sets forth an alternative exemplary embodiment 800 of the invention, illustrating a method of converting an operand to an analog output. At block 805, a number of accumulated addition operations are performed using an operand. At block 810, a serial digital output representative of the carry out bit from each of the number of accumulated addition operations is produced. A clock signal that defines a clock cycle is received at block 815. At block 820, the serial digital output is driven at a periodic interval corresponding to the frequency of the clock cycle. At block 825, the driven serial digital output is converted to an analog output which correlates to the value of the operand by averaging the driven serial digital output over one or more conversion periods.

Figure 8A:
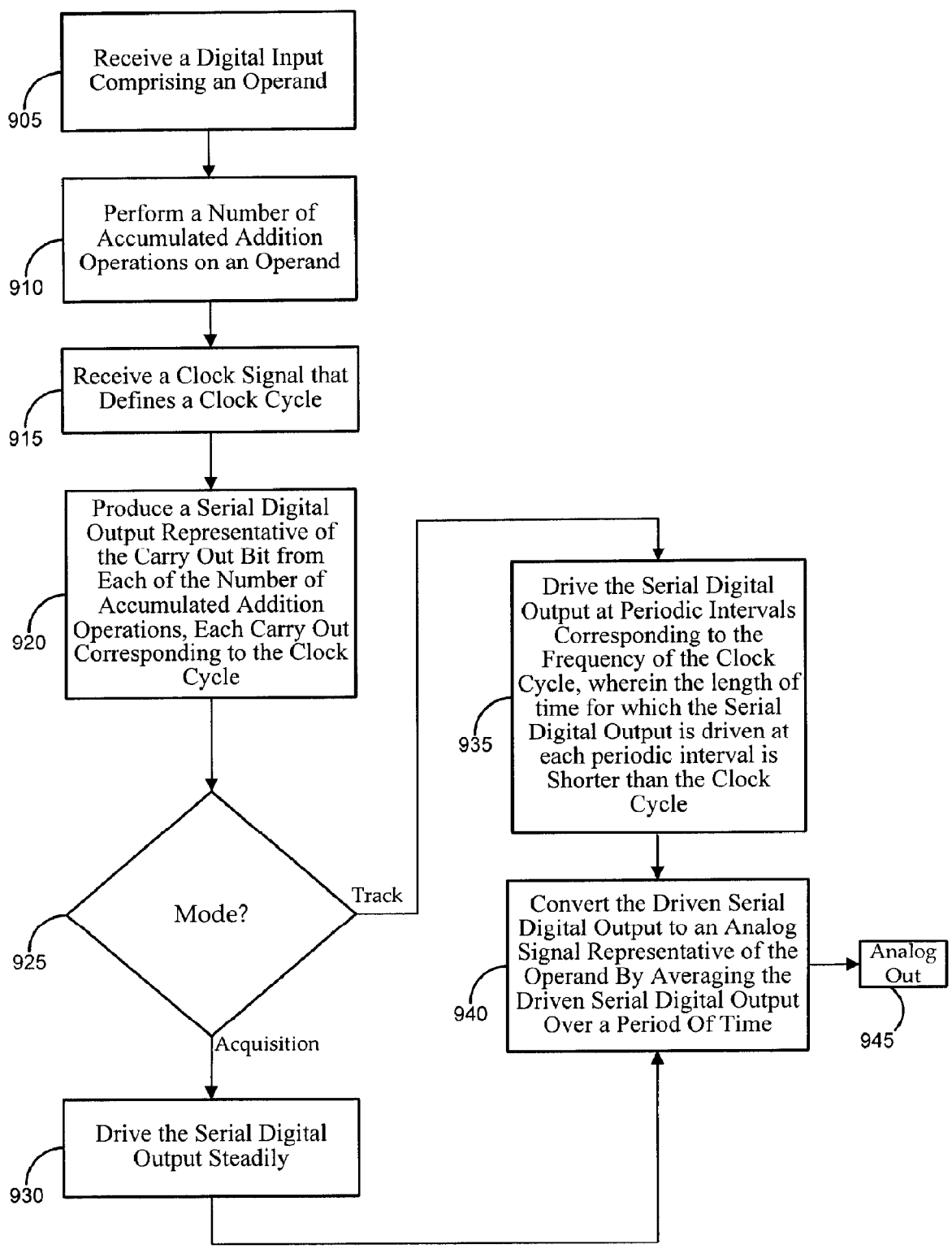
FIG. 8A is a flowchart illustrating a method of converting an operand to an analog output using alternative modes, according to various embodiments of the present invention.

FIG. 8A sets forth an alternative exemplary embodiment 900A of the invention, illustrating a method of converting an operand to an analog output utilizing alternative selectable modes. At block 905, a digital input is received, comprising an operand. At block 910, a number of accumulated addition operations are performed using the operand. At block 915, a clock signal is received, the clock signal defining a clock cycle. A serial digital output representative of the carry out bit from each of the number of accumulated addition operations is produced at block 920, each carry out corresponding to the clock cycle. Over a conversion period, the serial digital output is representative of the value of the operand.

At block 925, a mode is selected. If Acquisition mode is selected, the serial digital output is driven steadily at block 930. If Track mode is selected, the serial digital output is driven at periodic intervals corresponding to the frequency of the clock cycle at block 935. In this embodiment, the length of time for which the serial digital output is driven at each periodic interval is shorter than the clock cycle. At block 940, regardless of whether Acquisition or Track mode has been selected, the driven serial digital output is converted to an analog signal representative of the operand by averaging the driven serial digital output over a period of time. The analog signal is output at block 945.

Figure 8B:
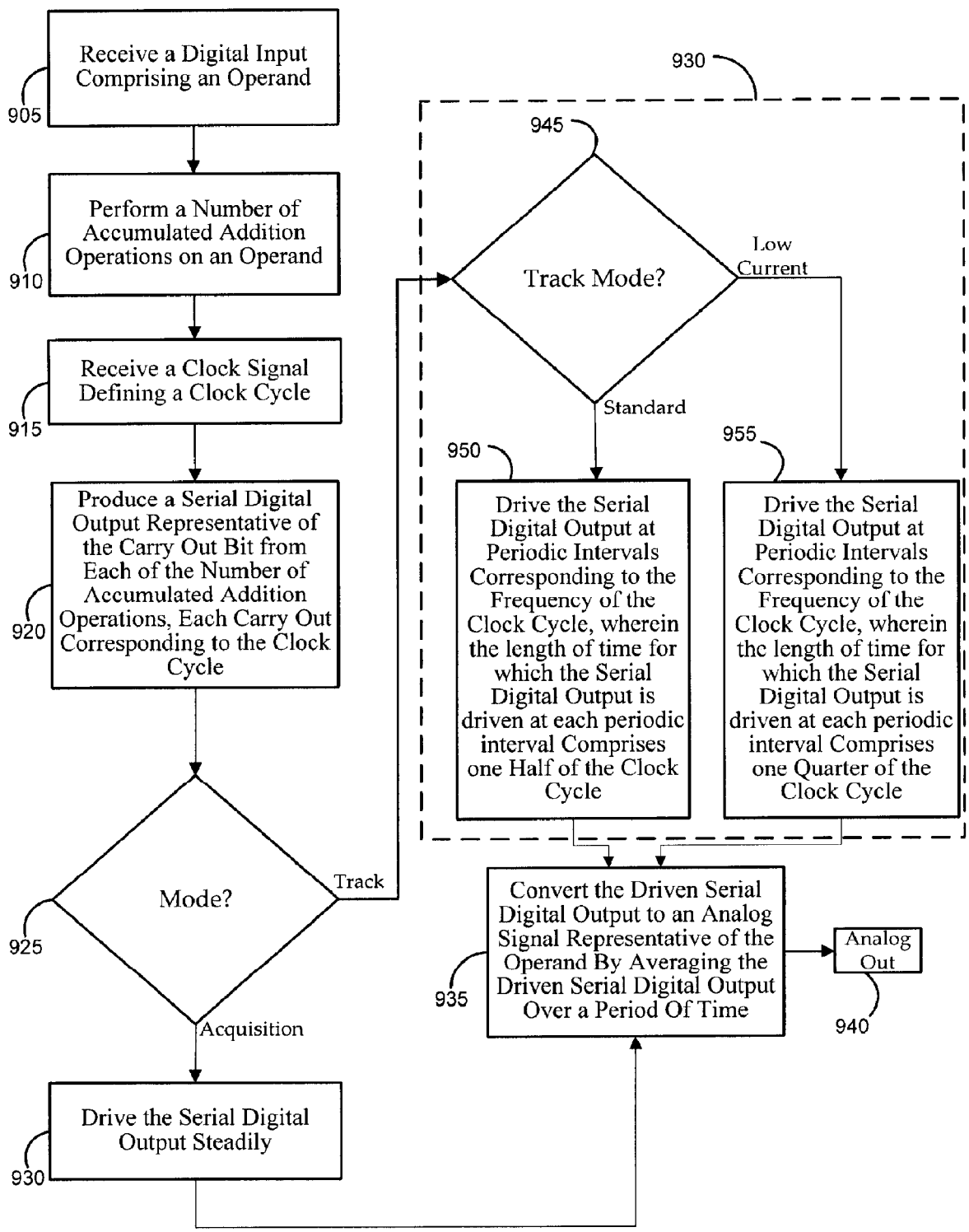
FIG. 8B is a flowchart illustrating a method of converting an operand to an analog signal using alternative Track modes, according to various embodiments of the present invention.

FIG. 8B sets forth an alternative exemplary embodiment 900B of the invention, illustrating a variation on the embodiment for converting an operand to an analog output addressed in FIG. 8A. Specifically, FIG. 8B provides an exemplary variation on block 930. If Track mode is selected at block 925, alternative types of Track modes are available to be selected at block 945. If Standard Track mode is selected, at block 950, the serial digital output is driven at periodic intervals corresponding to the clock cycle, wherein the length of time for which the serial digital output is driven at each periodic interval comprises one half of the clock cycle. If Low Current Track Mode is selected, at block 955, the serial digital output is driven at periodic intervals corresponding to the clock cycle, wherein the length of time for which the serial digital output is driven at each periodic interval comprises one quarter of the clock cycle. In other embodiments, other options may be available to drive the serial digital output for shorter periods (e.g., drive ⅛ time, drive 1/10 time, etc.). For example, there are a number of delay circuits known in the art that may be configured to be used, perhaps with a Tristate driver, to produce other drive periods of different durations. In some embodiments, there may be a number of tunable delay lines each selectable and tunable by a control unit to provide a wide range of options. Also, periodic intervals at which the serial digital output is driven may comprise any number of cycles (e.g., every two cycles, every 4 cycles, every 10 cycles, etc.). The options will be evident to those skilled in the art, and this functionality can be implemented in any manner known in the art.

It should be noted that the methods, systems and devices discussed above are intended merely to be exemplary in nature. It must be stressed that various embodiments may omit, substitute, or add various procedures or components as appropriate. For instance, it should be appreciated that in alternative embodiments, the methods may be performed in an order different than that described, and that various steps may be added, omitted or combined. Also, features described with respect to certain embodiments may be combined in various other embodiments. Different aspects and elements of the embodiments may be combined in a similar manner.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments. While it is noted that digital circuits are described herein, it will be recognized that there are a number of different circuit configurations (both analog and digital) available to implement the logic described. Also, it should be emphasized that technology and electronics evolve and, thus, many of the elements are exemplary in nature and should not be interpreted to limit the scope of the invention. Thus, the description should not be taken as limiting the scope of the invention, which is defined in the claims.

Also, it is noted that the embodiments may be described as a process which is depicted as a flow chart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figures.

Furthermore, certain embodiments (e.g., embodiments including the control unit) may be implemented at least in part by hardware, software, firmware, middleware, microcode, hardware description languages, or any combination thereof. When implemented in software, firmware, middleware or microcode, the program code or code segments to perform the necessary tasks may be stored in a machine readable medium such as a storage medium. Processors may perform the necessary tasks.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be required before the above elements are considered. Accordingly, the above description should not be taken as limiting the scope of the invention, which is defined in the following claims.

What is claimed is:

1. A method of producing an analog output from a received digital input, the method comprising:
   receiving a digital pulse train having an average value which is proportional to a digital conversion value;
   driving the pulse train at a periodic interval to produce a modulated tristate-gate output;
   averaging the modulated tristate-gate output to produce an analog signal reflective of the digital conversion value; and
   driving the pulse train at a second periodic interval, the second periodic interval having a duty cycle of less than 50% so that the modulated tristate-gate output is more often disabled than enabled.

2. The method of claim 1 wherein the driving the pulse train at a second periodic interval is in response to an indication to enter a low power operating mode.

3. The method of claim 1 wherein the driving the pulse train at a second periodic interval is in response to an indication to decrease the loop bandwidth of a feedback system in which the analog signal reflective of the digital conversion value is a control signal.

4. A method of producing an analog output from a received digital input, the method comprising:
   receiving a digital pulse train having an average value which is proportional to a digital conversion value;
   driving the pulse train at a periodic interval to produce a modulated tristate-gate output;
   averaging the modulated tristate-gate output to produce an analog signal reflective of the digital conversion value; and
   driving the pulse train at a third periodic interval, the third periodic interval having a duty cycle of greater than 50% so that the modulated tristate-gate output is more often enabled than disabled.

5. The method of claim 4 wherein the driving the pulse train at a second periodic interval is in response to an indication to increase the loop bandwidth of a feedback system in which the analog signal reflective of the digital conversion value is a control signal.

6. A method of producing an analog output from a received digital input, the method comprising:
   receiving the digital input over a conversion period;
   accumulating the digital input at each predetermined clock period during the conversion period;
   outputting a carry value based on the accumulation;
   selectively driving or tristating the carry value during the conversion period based on a state of a control signal to produce a modulated tristate-gate output signal; and
   averaging the modulated tristate-gate output signal.

7. The method of claim 6, wherein accumulating the digital input comprises summing the digital input with a previous accumulated value.

8. The method of claim 6, wherein accumulating the digital input comprises calculating a modulo-$2^N$ accumulation of an N-bit digital input.

9. The method of claim 6, wherein selectively driving or tristating the carry value comprises selectively tristating the carry value during a portion of at least one predetermined clock period during the conversion period.

10. The method of claim 6, wherein selectively driving or tristating the carry value comprises selectively tristating the carry value during a portion of each predetermined clock period during the conversion period.

11. An apparatus for producing an analog output from a received digital input, the apparatus comprising:
    an accumulator configured to receive a digital input and output a pulse train having an average value proportional to a digital conversion value;
    a driver coupled to the accumulator and configured to selectively tristate an output during a conversion period based in part on a state of a control signal to produce a modulated tristate-gate output signal; and
    a filter coupled to the driver and configured to average the modulated tristate-gate output signal to produce the analog output.

12. The apparatus of claim 11, wherein the digital input comprises an N-bit digital input and the accumulator is configured to perform a modulo-$2^N$ accumulation on the digital input and output a carry output as the pulse train.

13. The apparatus of claim 11, wherein the driver is configured to continuously drive the output when the control signal is in a first state.

14. The apparatus of claim 13, wherein the driver is configured to periodically tristate the output when the control signal is in a second state, distinct from the first state.

15. The apparatus of claim 11, wherein the driver is configured to have a high impedance output for approximately one-half the conversion period based on the state of the control signal.

16. The apparatus of claim 11, wherein the driver is configured to have a high impedance output for greater than approximately one-half the conversion period based on the state of the control signal.

* * * * *